(12) United States Patent
Chang et al.

(10) Patent No.: US 7,012,484 B2
(45) Date of Patent: Mar. 14, 2006

(54) FILTER USING MULTILAYER CERAMIC TECHNOLOGY AND STRUCTURE THEREOF

(75) Inventors: Sheng-Fuh Chang, Department of Electrical Engineering, National Chung Cheng University, 160 San-Hsing, Min-Hsiung, Chia-Yi 621 (TW); Yng-Huey Jeng, Chia-Yi (TW)

(73) Assignees: Integrated System Solution Corp., Hsinchu (TW); Sheng-Fuh Chang, Chiayi (TW)

( * ) Notice: Subject to any disclaimer, the term of this patent is extended or adjusted under 35 U.S.C. 154(b) by 0 days.

(21) Appl. No.: 10/831,318

(22) Filed: Apr. 26, 2004

(65) Prior Publication Data

US 2005/0237131 A1 Oct. 27, 2005

(51) Int. Cl.
*H01P 1/203* (2006.01)
(52) U.S. Cl. ........................... 333/175; 333/204
(58) Field of Classification Search ............. 333/175, 333/176, 204, 205
See application file for complete search history.

(56) References Cited

U.S. PATENT DOCUMENTS

| | | | | |
|---|---|---|---|---|
| 3,451,015 A | * | 6/1969 | Heath | 333/203 |
| 4,433,315 A | * | 2/1984 | Vandegraaf | 333/174 |
| 5,144,268 A | * | 9/1992 | Weidman | 333/204 |
| 5,523,729 A | | 6/1996 | Nakai et al. | 333/177 |
| 6,417,745 B1 | * | 7/2002 | Taniguchi | 333/185 |
| 6,437,665 B1 | * | 8/2002 | Kato | 333/185 |

OTHER PUBLICATIONS

Article entitled "A Compact Second-Order LTCC Bandpass Filter With Two Finite Transmission Zeros" by Yeung et al. published in IEEE Transactions on Microwave Theory And Techniques, vol. 51, No. 2, Feb. 2003, pp 337-341.
Article entitled "Design of a 2-Pole LTCC Filter for Wireless Communications" by Piatnitsa et al., published in IEEE Transactions on Wireless Cimmunications, vol. 3, No. 2, Mar. 2004, pp 379-381.
Article entitled "Design of Miniature Multilayer On-Package Integrated Image-Reject Filters" by Sutono et al., published in IEEE Transactions on Microwave Theory And Techniques, vol. 51, No. 1, Jan. 2003 pp. 156-162.

(Continued)

*Primary Examiner*—Seungsook Ham
(74) *Attorney, Agent, or Firm*—Michael Bednarek; Pillsbury Winthrop Shaw Pittman LLP

(57) ABSTRACT

The present invention discloses a filter using multilayer ceramic technology. The filter comprises an input port, an output port, a first lumped resonator and a first step-impedance resonator connected to the input port, a second lumped resonator and a second step-impedance resonator connected to the output port, a coupling capacitor used for the coupling of the first lumped resonator and the first step-impedance resonator to the second lumped resonator and the second step-impedance resonator. The filter according to the present invention can provide the multi-transmission zeros in the stopband to isolate the adjacent channel and suppress the harmonics, and provide the transmission poles in the passband to have lower insertion loss. In addition, a manufacturing method for the filter using multilayer ceramic technology is also disclosed.

20 Claims, 6 Drawing Sheets

OTHER PUBLICATIONS

Article entitled "Harmonic-Suppression LTCC Filter With The Step-Impedance Quarter-Wavelength Open Stub" by Ching-Wen Tang, in IEEE Transactions on Microwave Theory And Techniques, vol. 52, No. 2, Feb. 2004, pp 617-624.

Article entitled "LTCC-MLC Duplexer for DCS-1800" by Jyh-Wen Sheen, published in IEEE Transactions on Microwave Theory And Techniques, vol. 47, No. 9, Sep. 1999, pp 240-242.

Article entitled "Multilayer LTCC Bandpass Filter Design With Enhanced Stopband Characteristics" by Wing-YanLeung et al., published in IEEE Microwave And Wireless Components Letters, vol. 12, No. 7, Jul. 2002. pp. 1883-1890.

* cited by examiner

US 7,012,484 B2

FILTER USING MULTILAYER CERAMIC TECHNOLOGY AND STRUCTURE THEREOF

BACKGROUND OF THE INVENTION

1. Field of the Invention

The present invention relates to a structure and design of the communication device, and more particularly, to a structure and design of the filter using multi-layer ceramic technology.

2. Description of the Related Art

Recently, the quality of communication service is getting higher due to the development of the advance wireless communication technology. Current communication products dainty not only to be light, thin, short and small, but also have good and stable communication quality. Particularly, in the wireless communication receiver, the filter is an indispensable device. The filter is mainly used for receiving the required signal and rejecting the undesired interference and noise attained by the antenna. In general, the filters are divided into lowpass filter, highpass filter, bandpass and bandstop filter according to their spectrum characteristic. Lowpass filter rejects the higher frequency signal and allows the passing of the lower frequency signal. Highpass filter rejects the lower frequency signal and allows the higher frequency signal. Bandpass filter passes the signal within a finite bandwidth and, in contrast, the bandstop filter rejects the signal within a finite bandwidth and passes the other signals spectrum.

According to the implement methods, the filters can be divided into three classes: lumped filter, distributed filter and semi-lumped filter which is combined from lumped elements with distributed circuit. In general, the distributed circuits are constructed from several transmission lines and the sizes of the transmission line are determined by the wavelength at the operating frequency. The distributed circuit operated at lower frequencies will have higher sizes, and therefore the semi-lumped or distributed filter is not suitable as operating below 200 MHz due to size limitation. However, the distributed circuit is very useful at higher microwave or millimeter-wave due to the smaller size than that of the lumped circuit. Although the lumped filter has feature of the compact size, it become impractical as operating at frequencies higher than GHz due to larger power dissipation and the parasitic effect. The lumped circuits can be much improved by the use of the superconductor recently, but such application is limited except in the universal space since the superconductor device must operate at ultra low temperature.

The ceramic filter using high dielectric constant ceramics, such as coaxial or mono-block type, are extensively used due to their features of miniaturized size and excellent performance. Such high performance filter is resulted from circular or smooth conductor geometry, and therefore the conducting loss is lower. The features of the miniaturized size are resulted from the use of the high dielectric constant material causing shorter wavelength. Such filters use the transmission line of quarter wavelength to realize the impedance transformer, addimitance transformer and resonator, and therefore the use of low dielectric constant materials are not suitable as operating between several hundred MHz and several GHz.

Recently, the low temperature co-fire ceramic technology used in the RF circuit attracts much attention. The multi-layer ceramic integrated circuits using low temperature co-fire ceramic technology have several advantages, for example, the ability of the mass product; the high three dimension integration with embedded the capacitor, inductor and resistor into multi-layer to reduce the volume; and fabrication of all passive components in one process. Since the passive components occupy above 85% area of the planar RF circuit, and therefore such circuit structure can much reduce the size of the RF circuit module.

U.S. Pat. No. 5,523,729, issued to Nakai et al, discloses similar multi-layer bandpass filter. The conventional circuit comprises input and output coupling capacitance, resonator-capacitance, resonator-coupling inductance and pole-tuning capacitance. However, there are two disadvantages in the patent. The first is that the filter performance will be effected by the adjacent circuit or the coupling effect between the devices since the part of the filter are exposed in the air. The second is that the filter is not easily integrated with other sub-module into single and miniaturized module of multi-function since the filter can not be embedded into the dielectric layer.

W. R. Smith et al. in "Design of Miniature Multilayer On-Package Integrated Image-Reject Filters," of IEEE Trans. Microwave Theory Tech., vol. 51, No 1 January 2003 proposes a circuit structure of the multi-layer filter, enable to have a transmission zero in the rejection band. However, such filter needs larger grounding capacitance, and therefore the use of the high dielectric constant substrate is needed to reduce the size. The high dielectric constant substrate causes the finer line spacing and line width, and therefore the filter performance is sensitive to the variation of the fabrication. Moreover, the variation of inductance and capacitance used in the filter are in the fabrication process cause the shift of the transmission zero. This shift may be compensated by post-tuning process put it increases the cost of the filter.

According the above problems, the related field needs a new filter structure to overcome the disadvantage of the prior art.

SUMMARY OF THE INVENTION

It is an object of the present invention to provide a filter circuit. Comparing to the planar filter, the filter has the advantages of smaller size, higher transition slope at upper and lower passband edges, the higher selectivity of two adjacent channels, greater suppression of the higher order hormonics, and lower insertion loss than that of other filter.

It is another object of the present invention to provide a filter structure to implement the above filter circuit.

To achieve the above goals, the present invention provides a filter circuit. The filter circuit comprises an input port; an output port; a first lumped resonator, electrically connected to the input port; a second lumped resonator, electrically connected to the output port; a first step-impedance resonator, electrically connected to the input port; a second step-impedance resonator, electrically connected to the output port; a coupling capacitor, used for the coupling of the first lumped resonator and the first step-impedance resonator to the second lumped resonator and the second step-impedance resonator.

According to one aspect of the filter circuit of the present invention, a first transmission zero is generated when the first lumped resonator resonates at its self-resonant frequency, a second transmission zero is generated when the second lumped resonator resonates at its self-resonant frequency, a third transmission zero is generated when the first step-impedance resonator resonates at its self-resonant frequency, and a fourth transmission zero is generated when the second step-impedance resonator resonates at its self-resonant frequency. The generation of the transmission zeros can have higher slope at upper and lower passband edge to obtain the high selectivity between two adjacent channels. The frequency of the transmission zeros can be controlled by varying the value of the capacitance. Another, the parasitic ground capacitance of the coupling capacitor can be absorbed by the first step-impedance resonator and the second step-impedance resonator, and therefore the practical length of the first step-impedance resonator and the second step-impedance resonator are shorter than the quarter wavelength of the operating frequency.

According to another aspect of filter circuit of the present invention, the first lumped resonator and the first step-impedance resonator can form a parallel resonate tank to provide a transmission pole, and the second lumped resonator and the second step-impedance resonator can form another parallel resonate tank to provide another transmission pole. Therefore the filter has much insertion loss in the passband.

The present invention also provides a filter structure using multi-layer ceramic technology. The filter structure comprises a top ground plane; an input electrode; an output electrode; a first coupling capacitive layer, positioned below the top ground plane, having a first metal piece, one side of the first metal piece connected to the input electrode; a second coupling capacitance layer, positioned below the first coupling capacitive layer, having a second metal piece, one side of the second metal piece connected to the output electrode; an inductance layer, having a third metal piece and a fourth metal layer, one side of the third metal piece connected to the input electrode to form the lumped inductor and one side of the fourth metal piece connected to the output electrode to form the lumped inductor; a capacitance layer, having a fifth metal piece and a sixth metal piece, one side of the fifth metal piece connected to the third metal piece and formed as the lumped capacitor, and one side of the sixth metal piece connected to the fourth metal piece and formed as the lumped capacitor; a middle ground plane, positioned below the capacitance layer; a step-impedance layer, positioned below the middle layer, having a seventh metal piece and a eighth metal piece, one side of the seventh metal piece connected to the input electrode and one side of the eighth metal piece connected to the output electrode; and a bottom ground plane, positioned below the step-impedance layer.

According to one aspect of filter structure using multi-layer ceramic technology of the present invention, the input electrode and the output electrode can be coplanar feed-in or non-coplanar feed-in. This input and output feed-in design can conform the measuring technology and brings more flexibility.

According to another aspect of filter structure using multi-layer ceramic technology of the present invention, the third metal piece on the inductance layer and the fifth metal piece on the capacitance layer are in natural series-resonance to provide a first transmission zero and the fourth metal piece on the inductance layer and the sixth metal piece on the capacitance layer are in natural series-resonance to provide a second transmission zero. The generation of the transmission zeros can provide higher slope at upper and lower passband edge. The related position and size of the metal pieces can determine the coupling amount, and further determine the frequencies of transmission zeros.

According to another aspect of filter structure using multi-layer ceramic technology of the present invention, the seventh metal piece and the eighth metal piece on the steeped impedance layer are formed by the transmission line of high impedance and low impedance. By using the different step-impedance ratios, the seventh metal piece and the eighth metal piece on the steeped impedance layer can produce the third and fourth transmission zeros.

According to another aspect of filter structure using multi-layer ceramic technology of the present invention, the parasitic ground capacitance of the first coupling capacitance layer and the second coupling capacitance layer can be absorbed by the seventh metal piece and the eighth metal piece on the step-impedance layer, and therefore the practical length of the seventh metal piece and the eighth metal piece are shorter than one quarter wavelength of the operating frequency. Such design makes the whole volume more compact to conform the light, thin, short, small trend of the communication system.

BRIEF DESCRIPTION OF THE DRAWINGS

Other objects, advantages, and novel features of the invention will become more apparent from the following detailed description when taken in conjunction with the accompanying drawing.

DETAILED DESCRIPTION OF THE INVENTION

Although the invention has been explained in relation to several preferred embodiments, the accompanying drawings and the following detailed description are the preferred embodiment of the present invention. It is to be understood that the following disclosed descriptions will be examples of present invention, and will not limit the present invention into the drawings and the special embodiment.

Figure 1:
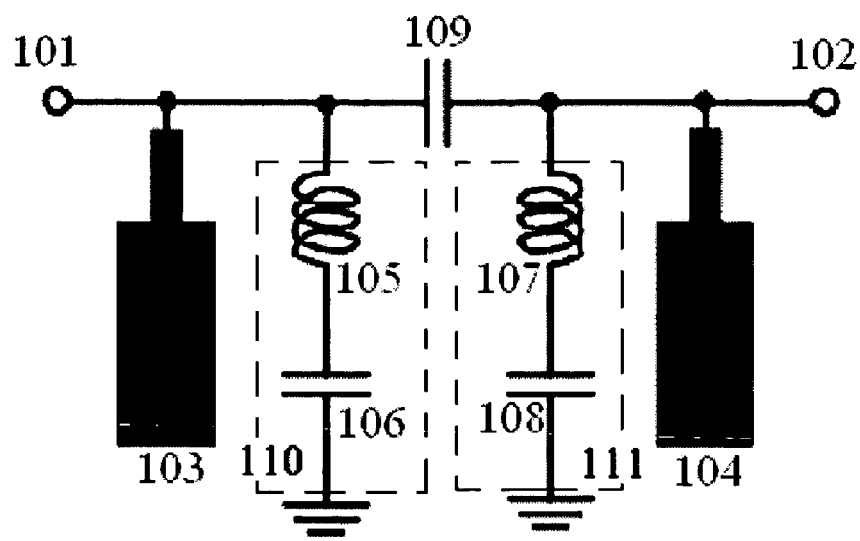
FIG. 1 is a schematic of a single-stage bandpass filter according to the present invention.

FIG. 1 is a circuit diagram illustrating the first embodiment of the filter according to the present invention. The filter circuit mainly comprises an input port 101, an output port 102, lumped resonator 110 and lumped resonator 111, step-impedance resonator 103 and step-impedance resonator 104 and a coupling capacitor 109. The step-impedance resonator 103 is electrically connected to the input port 101, and the step-impedance resonator 104 is electrically connected to the output port 102. The coupling capacitor 109 is used for the coupling of the first lumped resonator 110 and the first step-impedance resonator 103 to the second lumped resonator 111 and the second step-impedance resonator 104. The lumped resonator 110 is constructed from a first capacitor 105 and a first inductor 106. The first capacitor 106 and the first inductor 105 can be the lumped circuit. And, the lumped resonator 111 is constructed from a second capacitor 108 and a second inductor 107, which can be the lumped circuit. The step-impedance resonators 103, 104 in FIG. 1 are formed by transmission line, however the step-impedance resonators 103, 104 are formed by any other types of transmission line such as the miscrostrip, strip line or the coplanar waveguide line. According to the transmission line theory, the characteristic impedance of the transmission line is determined from the material of the substrate and the width of the transmission line. For special substrate material, the larger width will have smaller characteristic impedance of the transmission line. Then, the characteristic impedance ratios of step-impedance resonators 103, 104 can be determined by the designer. In general, the characteristic impedance ratios of step-impedance resonators 103 and 104 can be equal in order to symmetric spectrum response around passband of the filter. However, the characteristic impedance ratios are not necessary to be equal. Another tunable parameter of step-impedance resonators 103 and 104 are the electric length of the impedance respective microstrip line.

The parasitic ground capacitance of the coupling capacitor 109 can be absorbed by the first step-impedance resonator 103 and the second step-impedance resonator 104. Such design makes the practical length of the first step-impedance resonator 103 and the second step-impedance resonator 104 become shorter than one quarter wavelength of the operating frequency, and therefore reduce effectively the whole filter size.

From the circuit theory, the self-resonant frequency of the series resonance tank, composed of the capacitance and the inductance, is determined by the capacitive value and the inductive value; namely, the radical inverse of the product of the capacitive value and the inductive value. In previous filter circuit, a first transmission zero is generated when the first lumped resonator 110 resonates at its self-resonant frequency and a second transmission zero is generated when the second lumped resonator 111 resonates at its self-resonant frequency. It is noted that two different frequencies of the transmission zeros will be obtained if the product of the capacitive value and the inductive value of the first lumped resonator 110 is different with that of the second lumped resonator 111. The first step-impedance resonator 103 and the second step-impedance resonators 104 resonate when their input impedance or input admittance equal to zero. A third transmission zero is generated when the first step-impedance resonator 103 resonates at its self-resonant frequency and a fourth transmission zero is generated when the second step-impedance resonator 104 resonates at its self-resonant frequency. The designer can design the characteristic impedance ratios and the electric length of the respective transmission line to obtain the desired frequencies of transmission zeros. To generate the transmission zero and reduce the filter size, the conventional technology needs larger grounding capacitance and higher dielectric constant. But the substrate of higher dielectric constant usually causes thinner width, which brings tighter fabrication accuracy. Thus the filter performance becomes quite sensitive to the fabrication tolerance. Variation in the fabrication process will cause the frequency shift of the transmission zero although, on shift can be tuned by the post-tuning process, but will increase the cost of the filter. The four transmission zeros are the feature of the present invention. Comparing to the other inventions, the frequencies of transmission zeros of the present invention can be controlled to suppress the unwanted signal. Another feature of the present invention shows the larger grounding capacitance is not needed.

In addition, a high performance bandpass filter must over low insertion loss. The filter of the present invention can add the extra transmission poles in the passband to reduce the insertion loss. Now referring to the FIG. 2, it is an equivalent circuit illustrating the first embodiment of filter according to the present invention.

Figure 2:
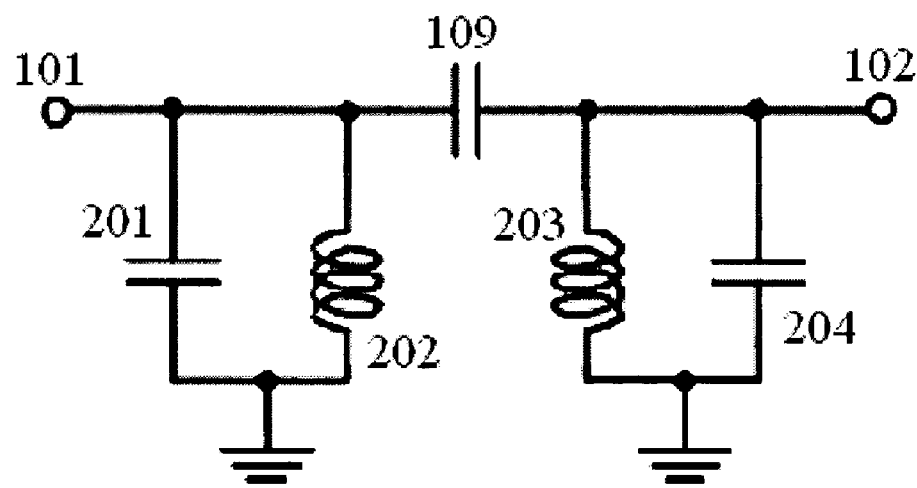
FIG. 2 is an equivalent circuit illustrating the first embodiment of the filter at the operating frequency according to the present invention.

Therefore, when the resonance frequency of the first lump resonator 110 is designed to lower than the filter passband frequency, it is equivalent to an inductor, dictated as the inductor 202 in FIG. 2. Similarly, when the resonance frequency of the first step-impedance resonator 103 is designed to be higher than the filter passband frequency, it is equivalent to a capacitor, dictated as the capacitor 201 in FIG. 2. The inductor 202 and the capacitor 201 from a parallel resonator, which generate a transmission pole in the filter passband. In contrast, when the resonance frequency of the first lump resonator 110 is designed to higher than the filter passband frequency, it is equivalent to a capacitor, dictated as the capacitor 201 in FIG. 2. Similarly, when the resonance frequency of the first step-impedance resonator 103 is designed to be lower than the filter passband frequency, it is equivalent to a inductor, dictated as the inductor 202 in FIG. 2. The inductor 202 and the capacitor 201 from a parallel resonator, which generate a transmission pole in the filter passband.

Another, when the resonance frequency of the second lump resonator 111 is designed to lower than the filter passband frequency, it is equivalent to an inductor, dictated as the inductor 203 in FIG. 2. Similarly, when the resonance frequency of the second step-impedance resonator 104 is designed to be higher than the filter passband frequency, it is equivalent to a capacitor, dictated as the capacitor 204 in FIG. 2. The inductor 203 and the capacitor 204 from a parallel resonator, which generate another transmission pole in the filter passband. In contrast, when the resonance frequency of the second lump resonator 111 is designed to higher than the filter passband frequency, it is equivalent to a capacitor, dictated as the capacitor 204 in FIG. 2. Similarly, when the resonance frequency of the second step-impedance resonator 104 is designed to be lower than the filter passband frequency, it is equivalent to a inductor, dictated as the inductor 203 in FIG. 2. The inductor 203 and the capacitor 204 from a parallel resonator, which generate another transmission pole in the filter passband.

It is noted the self-resonant frequency of the first lumped resonator 110 can be designed to be higher or lower than the self-resonant frequency of the first step-impedance resonator 103, and the self-resonant frequency of the second lumped resonator 111 can be designed to be higher than the self-resonant frequency of the second step-impedance resonator 104. Therefore, there are several variations and modifications. Another, the above described parallel resonant circuit combined with the coupling capacitance 109 can further provide another transmission pole to reduce the insertion loss of the desired filter.

Figure 3:
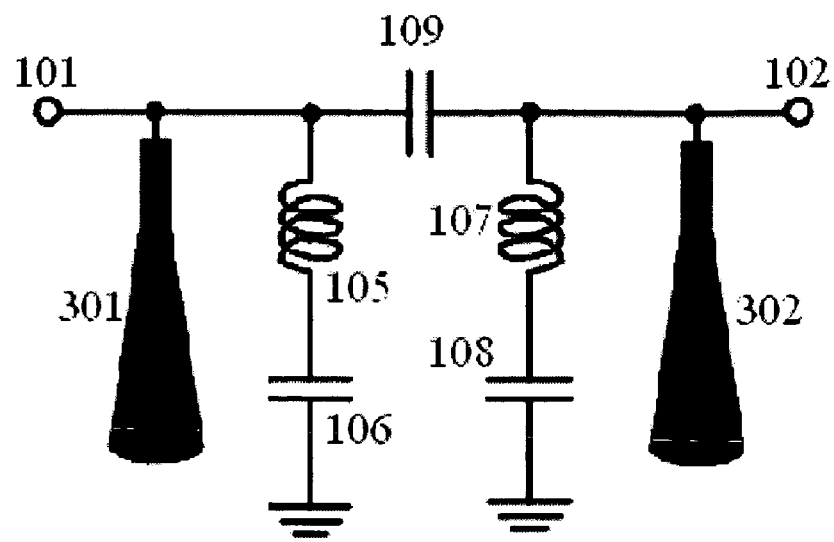
FIG. 3 is a circuit diagram illustrating the second embodiment of the filter using for broadband suppressing according to the present invention.

Now referring to the FIG. 3, it is a circuit diagram illustrating the second embodiment of the filter using for broadband suppressing according to the present invention. The second embodiment is the modification of the first embodiment, and the major circuits are similar to the first embodiment. The major difference is that the characteristic impedance of the first step-impedance resonator 103 and the second step-impedance resonator 104 varies smoothly to form a first smooth step-impedance resonator 301. Similar smooth variation of impedance ratio of the second step-impedance resonator 104 is applied to become a second smooth impedance resonator 302 a second smooth step-impedance resonator 302.

Figure 7:
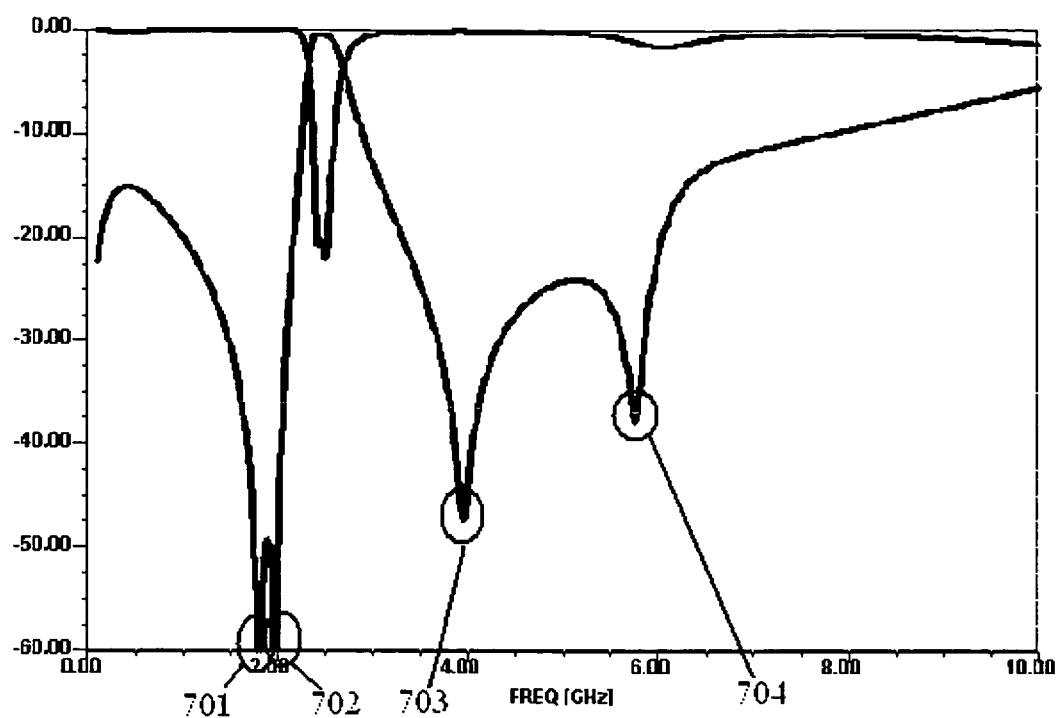
FIG. 7 is a frequency response illustrating the second embodiment of the filter according to the present invention.

Referring to FIG. 7, it is the frequency response illustrating the second embodiment of the filter according to the present invention. For a broad stop-band suppression, the transmission zeros need to be shifted above the filter passband The first lumped resonator 110 of the filter provides a first transmission zero 701 and the second lumped resonator 111 of the filter provides a second transmission zero 702. The first step-impedance resonator 103 is deformed to the first smooth step-impedance resonator 301 to give the transmission zero 703 and the second step-impedance resonator 104 is deformed to be the second smooth step-impedance 302 to offer the transmission zero 704. FIG. 7 is a frequency response illustrating the second embodiment of the filter according to the present invention. The filter response of the second embodiment of the filter shows the center frequency of 2.45 GHz, the first transmission zero 701 at 1.8 GHz with −60 dB suppression, the second transmission zero 702 at 1.9 GHz with −60 dB suppression, the third transmission zero 703 at 4 GHz with −47 dB suppression and the fourth transmission zero 704 at 5.8 GHz with −37 dB suppression. No other obvious harmonic response appears from 4 to 10 GHz in FIG. 7.

Figure 4:
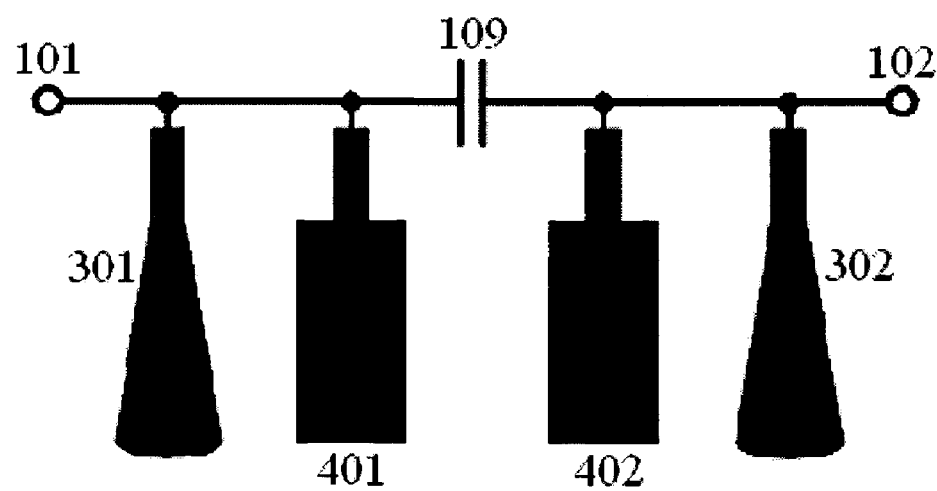
FIG. 4 is a circuit diagram illustrating the third embodiment of the filter suitable for high passband frequency situation according to the present invention.

Now referring to the FIG. 4, it is a circuit diagram illustrating the third embodiment of the filter suitable for high passband frequency situation according to the present invention. The third embodiment is the modification of the first and second embodiment, and the circuit is similar to the second embodiment except major differences are the first lumped resonator 110 and the second lumped resonator 111 are replaced by a first equivalent step-impedance resonator 401 and a second equivalent step-impedance resonator 402. So called first equivalent step-impedance resonator 401 and the second equivalent step-impedance resonator 402 are similar the first step-impedance resonator 103 and a second step-impedance resonator 104 having the transmission lines with different characteristic impedance ratios. From the filter theory, the step-impedance resonator has better suppression in the higher frequency range. By properly choosing the impedance ratios of step-impedance resonator and the electric lengths of the transmission line, one can obtain the desired frequencies of the transmission zeros to suppress the spurious response. Therefore the first lumped resonator 110 is replaced by a first equivalent step-impedance resonator 401 and the second lumped resonator 111 is replaced by a second equivalent step-impedance resonator 402, a here the low impedance line is used to replace the equivalent capacitance and high impedance line is used to replace the inductance.

Figure 8:
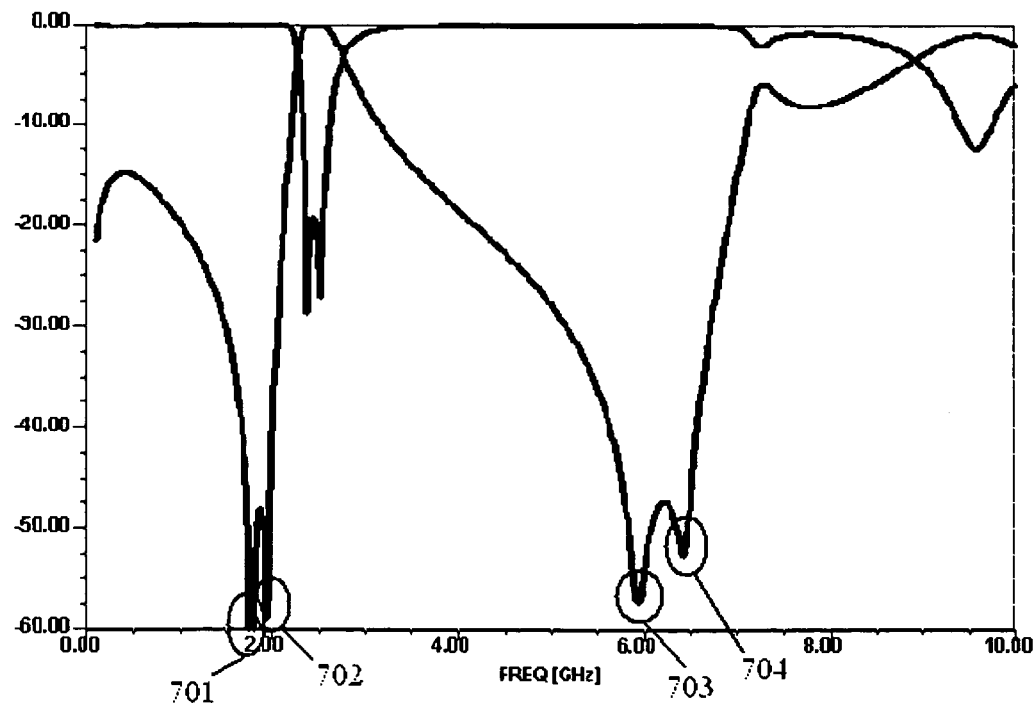
FIG. 8 is a frequency response illustrating the third embodiment of the filter according to the present invention.

FIG. 8 is a frequency response illustrating the third embodiment of the filter according to the present invention. The filter response of the third embodiment of the filter shows the first transmission zero 701 at 1.8 GHz with −60 dB suppression, the second transmission zero 702 at 1.9 GHz with −59 dB suppression, the third transmission zero 703 at 5.9 GHz with −57 dB suppression and the fourth transmission zero 704 at 6.4 GHz with −52 dB suppression. Composed with FIG. 7, the third and fourth transmission zeros are shifted to higher frequencies. It also proves another feature of the present invention that the transmission zeros can be tuned arbitrarily.

Figure 5:
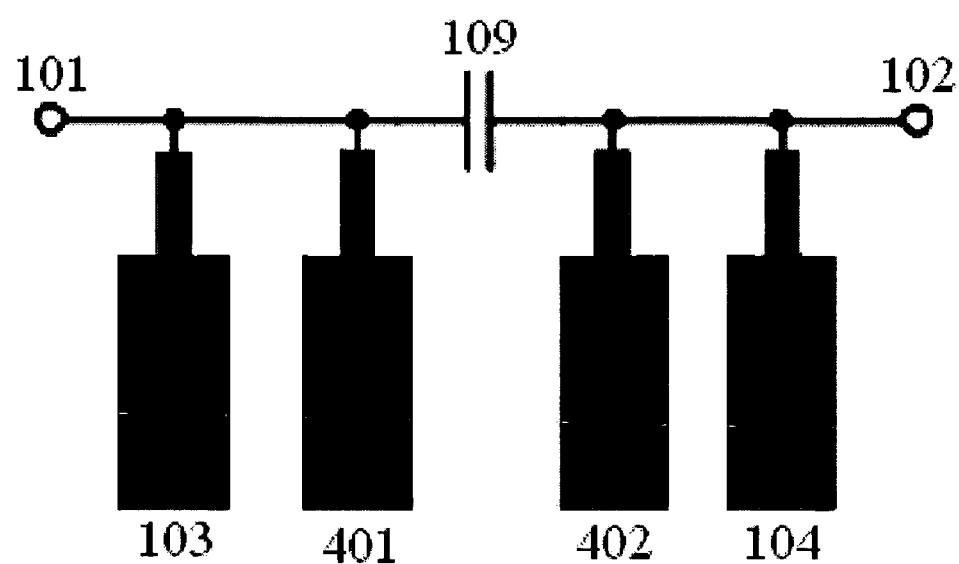
FIG. 5 is a circuit diagram illustrating the fourth embodiment of the filter using for high frequency according to the present invention.

Now referring to the FIG. 5, it is a circuit diagram illustrating the fourth embodiment of the filter used for further higher passband frequency situation according to the present invention. The fourth embodiment is the modification of the first embodiment, and the circuit is similar to the first embodiment except major differences are the first lumped resonator 110 and the second lumped resonator 111 are replaced by the first equivalent step-impedance resonator 401 and a second equivalent step-impedance resonator 402. The lumped circuits are not suit for filter operating at ultra high frequency, since the corresponding capacitive and inductive values are not found in the fabrication. Therefore, the transmission line of step-impedance is used to replace the capacitive and inductive values of the lumped circuit. Therefore the first lumped resonator 110 is replaced by a first equivalent step-impedance resonator 401 and the second lumped resonator 111 is replaced by a second equivalent step-impedance resonator 402, a here the low impedance line is used to replaced the capacitance and high impedance line is used to replace the inductance.

Figure 9:
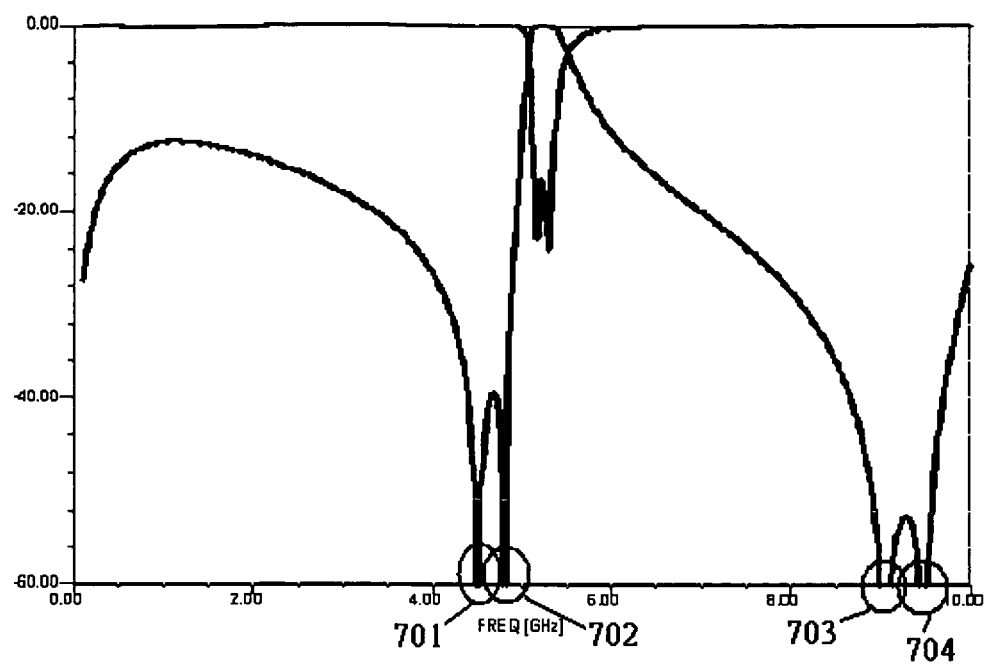
FIG. 9 is a frequency response illustrating the fourth embodiment of the filter according to the present invention.

FIG. 9 is a frequency response illustrating fourth embodiment of the filter according to the present invention. The filter response of the second embodiment of the filter shows the center frequency of 5.2 GHz, the first transmission zero 701 at 4.4 GHz with −60 dB suppression, the second transmission zero 702 at 4.8 GHz with −60 dB suppression, the third transmission zero 703 at 9.0 GHz with −57 dB suppression and the fourth transmission zero 704 at 9.5 GHz with −52 dB suppression.

Figure 6:
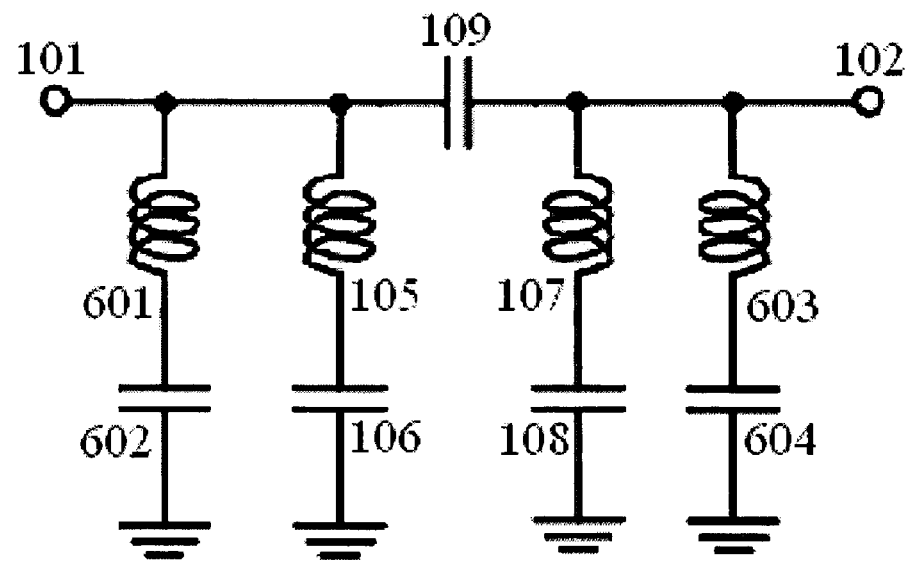
FIG. 6 is a circuit diagram illustrating the fifth embodiment of the filter using for low frequency according to the present invention.
Figure 10:
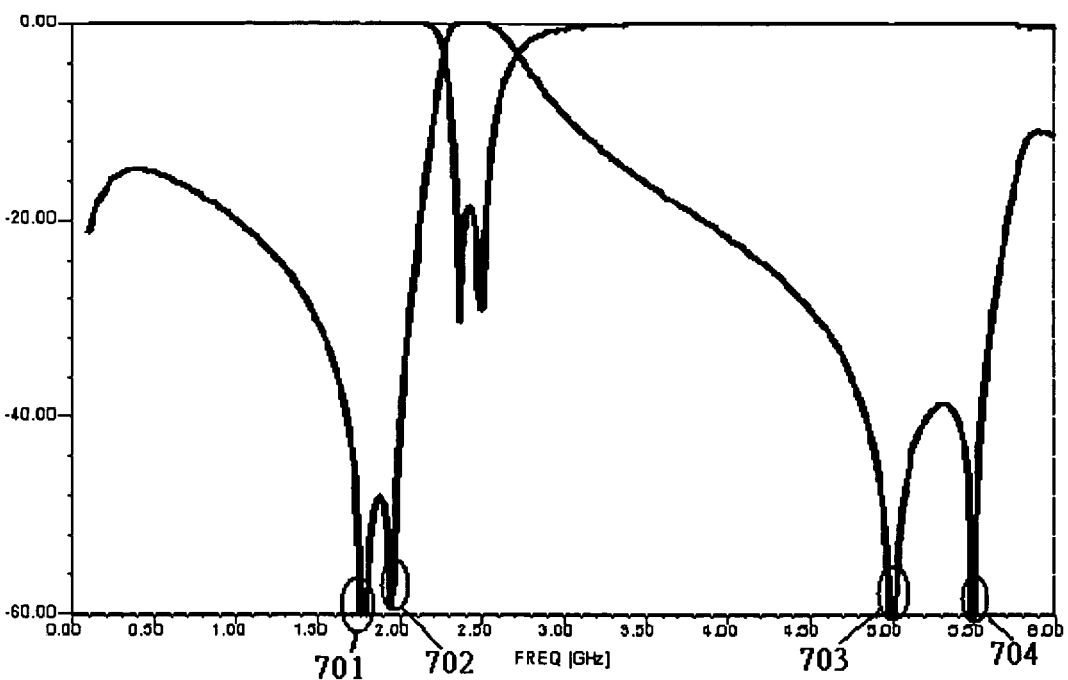
FIG. 10 is a frequency response illustrating the fifth embodiment of the filter according to the present invention.

Now referring to the FIG. 6, it is a circuit diagram illustrating the fifth embodiment of the filter suitable for low passband frequency range situation according to the present invention. The fifth embodiment is the modification of the first embodiment, where the first step-impedance resonator 103 is replaced by a equivalent inductor 601 and a equivalent capacitor 602, and a second step-impedance resonator 104 is replaced by a equivalent inductor 603 and a equivalent capacitor 604. FIG. 10 is a frequency response illustrating fifth embodiment of the filter according to the present invention. The filter response of the fifth embodiment of the filter shows the center frequency of 2.45 GHz, the first transmission zero 701 at 1.8 GHz with −60 dB suppression, the second transmission zero 702 at 1.9 GHz with −57 dB suppression, the third transmission zero 703 at 5.0 GHz with −60 dB suppression and the fourth transmission zero 704 at 5.5 GHz with −60 dB suppression.

Figure 11:
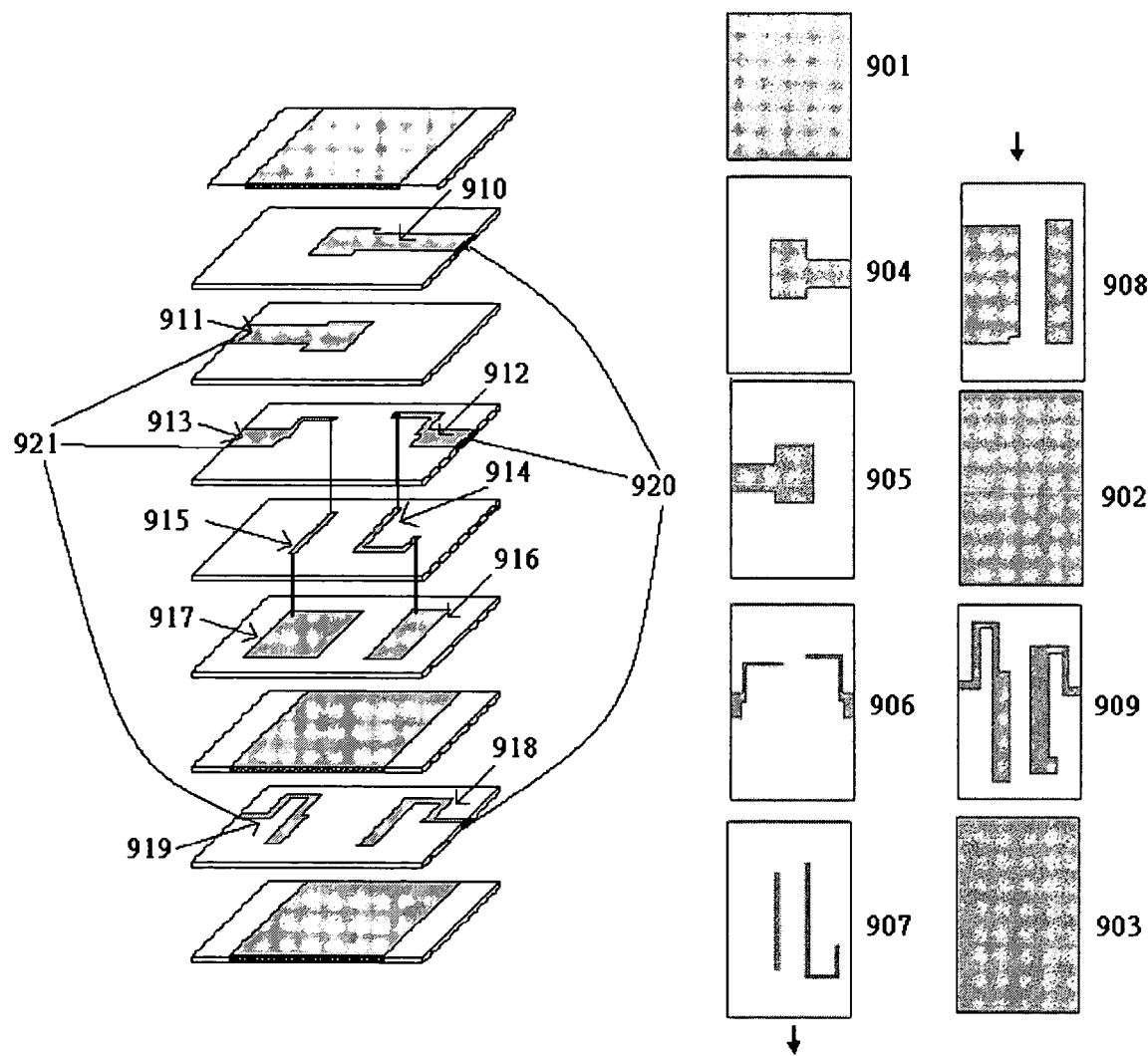
FIG. 11 is a filter structure using multi-layer ceramic technology of the preferred embodiment of the filter according to the present invention.

FIG. 11 is a filter structure using multi-layer ceramic technology of the preferred embodiment of the filter according to the present invention. The left part of the FIG. 11 is the perspective drawing of the filter structure and the right part is the top view of the each layer in the filter structure. The filter structure mainly comprises a top ground plane 901; a middle ground plane 902; a bottom ground plane 903; an input electrode 921; an output electrode 920; a first coupling capacitive layer 904, having a first metal piece 910, one side of the first metal piece 910 connected to the output electrode 920; a second coupling capacitance layer 905, having a second metal piece 911, one side of the second metal piece 911 connected to the input electrode 921; a first inductance layer 906, having a metal piece 912 and a metal layer 913, one side of the metal piece 912 connected to the output electrode 920 and one side of the metal piece 913 connected to the input electrode 921; a second inductance layer 907, having a metal piece 914 and a metal layer 915;

a capacitance layer 908, having a metal piece 916 and a metal piece 917; a step-impedance layer 909, having a metal piece 918 and a metal piece 919, one side of the metal piece 918 connected to the output electrode 920 and one side of the metal piece 919 connected to the input electrode 921. The input electrode 921 and the output electrode 920 can be coplanar feed-in or non- coplanar feed-in to receive the signals and are formed from the metal. In the filter structure of the preferred embodiment of the present invention, the metal piece 912, metal piece 914 and metal piece 916 on the first inductance layer 906, the second inductance layer 907 and the capacitance layer 908, respectively, are partially overlapped from the top or bottom view. The metal piece 913, metal piece 915 and metal piece 917 on the first inductance layer 906, the second inductance layer 907 and the capacitance layer 908, respectively, are partially overlapped from the top or bottom view. Such designs are beneficial to the designer to select the coupling amount, determining the frequency of the transmission zeros. And then the filter can have good selectivity. The metal piece 912 on the first inductance layer 906 and the metal piece 914 on the second inductance layer 907 can be three dimensional structure to form the lumped inductor, and the metal pieces on the different layers can be connected by the via holes. It is noted that the lumped inductor can be formed by the planar spiral type, and therefore the metal piece 914 and the metal piece 915 on the second inductance layer 907 are not needed. Another, the metal piece 916 and the metal piece 917 on the capacitance layer 908 from a three-dimensional metal-insulator-metal capacitor. It is noted the lumped capacitor can be also formed with the planar inter-digital type. A first transmission zero is generated as the metal piece 912, metal piece 914 and metal piece 916 on the first inductance layer 906, the second inductance layer 907 and the capacitance layer 908 respectively resonate naturally. A second transmission zero is generated as the metal piece 913, metal piece 915 and metal piece 917 on the first inductance layer 906, the second inductance layer 907 and the capacitance layer 908 respectively resonate naturally. The middle ground plane 902 is used for isolating the electromagnetic coupling between the lumped circuit layer and the step-impedance layer. In the preferred embodiment of the present invention, the metal piece 918 and the metal piece 919 on the step-impedance layer 909 are constructed from the transmission line with high characteristic impedance and low characteristic impedance. Different characteristic impedance ratios are used to form the equivalent capacitance and inductance to provide the third and the fourth transmission zeros.

From the above theory, the metal piece 912, metal piece 914 and metal piece 916 on the first inductance layer 906, the second inductance layer 907 and the capacitance layer 908 respectively and the metal piece 918 on the steeped impedance layer form the equivalent parallel resonant circuit, generating a transmission pole. The metal piece 913, metal piece 915 and metal piece 917 on the first inductance layer 906, the second inductance layer 907 and the capacitance layer 908 respectively and the metal piece 919 on the steeped impedance layer form another equivalent parallel resonant circuit, generating another transmission pole. The area of the metal piece determine the capacitive and inductive value, and such designs are benefit to the designer to select the capacitive and inductive value, determining the frequency of the transmission poles. Therefore, the filter has good passband performance.

The first coupling capacitive layer 904 and the second coupling capacitance layer 905 form the coupling capacitance 109. The parasitic ground capacitance of the first coupling capacitance layer 904 and the second coupling capacitance layer 905 can be absorbed by the metal piece 918 and the metal piece 919 on the step-impedance layer 909, and therefore the practical length of the metal piece 918 and the metal piece 919 are shorter than one quarter wavelength of the operating frequency. The above described parallel resonant circuit combined with the coupling capacitance 109 can provide another transmission pole to reduce the insertion loss of the designed filter.

Each layer of above description is fabricated by using the thick film method. Namely, the ceramic powders go through the ball mixing, calcining and then become the green tape after the taping process. The thickness of each layer of the above description is dependent on the practical design requirement and is prefer to have the range between 1 $\mu$m to 200 $\mu$m. The fabrication of filter must further go through the punching via-holes, filling via-holes with conductive materials, screen printing, laminating, stacking, born-out and sintering. The ceramic using in the low temperature co-fire ceramic technology is so called low temperature co-fire ceramic and the sintering temperature must be lower than 961° C. to be suitable for the co-fire with the silver. In general, the low temperature co-fire ceramics are usually glass ceramics having the dielectric constant between 5–10, and the metal piece is usually formed from eliminating the organic material of the metal paste with silver. Low temperature co-fire ceramics technology attracts much attenuation in the application of the RF circuit. The multi-layer ceramic integrated circuits fabricated by the low temperature co-fire ceramics technology have several advantages: the ability of the mass product; the high three-dimensional integration embedding the capacitor, inductor and resistor into multi-layer to reduce the volume; and fabrication of all passive components in one process. Therefore the filters of the present invention have extremely high application value.

The filter structure of the present invention can be easily fabricated by using the low temperature co-fire ceramic process and is suitable for apply in the multifunction and multimode wireless local network system. The filter structure has properties of light, thin, short and small, which are extremely fulfilled to be suit for the requirement of the modem electronic product.

In addition, the filter structure of the present invention has the following advantages:

First, the use of the low temperature co-fire ceramic technology can embed the passive component into substrate and integrate the other modules.

Second, the filters of the present invention have four transmission zeros to suppress the signals in the passband edge and have higher attenuation rate.

Third, the transmission zeros of the filter of the present invention can be tunable to suppress the undesired harmonics.

Fourth, the filters of the present invention can add the transmission poles in the passband to have the lower insertion loss, compared with the other filter.

Although the invention has been explained in relation to its preferred embodiment, it is to be understood that many other possible modifications and variations can be made. For example, the relative position and distance of the metal piece on each layer, the coupling amount of the coupling capacitance and the frequencies of the transmission zeros can be made without departing from the spirit and scope of the invention as hereinafter claimed.

What is claimed is:

1. A filter circuit comprising:
   an input port;
   an output port;
   a first lumped resonator, electrically connected to the input port;
   a second lumped resonator, electrically connected to the output port;
   a first step-impedance resonator, electrically connected to the input port;
   a second step-impedance resonator, electrically connected to the output port; and
   a coupling capacitor, used for the coupling of the first lumped resonator and the first step-impedance resonator to the second lumped resonator and the second step-impedance resonator;
   wherein the first lumped resonator comprises a first capacitor and a first inductor, and the second lumped resonator comprises a second capacitor and a second inductor.

2. A filter circuit as claimed in claim 1, wherein a first transmission zero is generated when the first lumped resonator resonates at its self-resonant frequency and a second transmission zero is generated when the second lumped resonator resonates at its self-resonant frequency.

3. A filter circuit as claimed in claim 1, wherein a third transmission zero is generated when the first step-impedance resonator resonates at its self-resonant frequency and a fourth transmission zero is generated when the second step-impedance resonator resonates at its self-resonant frequency.

4. A filter circuit as claimed in claim 1, wherein the self-resonant frequency of the first lumped resonator is higher than the self-resonant frequency of the first step-impedance resonator.

5. A filter circuit as claimed in claim 1, wherein the self-resonant frequency of the first lumped resonator is lower than the self-resonant frequency of the first step-impedance resonator.

6. A filter circuit as claimed in claim 1, wherein the self-resonant frequency of the second lumped resonator is higher than the self-resonant frequency of the second step-impedance resonator.

7. A filter circuit as claimed in claim 1, wherein the self-resonant frequency of the second lumped resonator is lower than the self-resonant frequency of the second step-impedance resonator.

8. A filter circuit as claimed in claim 1, wherein the first lumped resonator and the first step-impedance resonator can form a first parallel circuit to provide a first transmission pole.

9. A filter circuit as claimed in claim 1, wherein the second lumped resonator and the second step-impedance resonator can form a second parallel resonant tank to provide a second transmission pole.

10. A filter circuit as claimed in claim 8, wherein the first parallel circuit and the coupling capacitor can provide a third transmission pole to reduce the insertion loss.

11. A filter circuit as claimed in claim 9, wherein the second parallel circuit and the coupling capacitor can provide a fourth transmission pole to reduce the insertion loss.

12. A filter circuit as claimed in claim 1, wherein the characteristic impendence ratios of the first step-impedance resonator and the second step-impedance resonator vary smoothly.

13. A filter circuit as claimed in claim 1, wherein the parasitic ground capacitance of the coupling capacitor can be absorbed by the first step-impedance resonator and the second step-impedance resonator, and therefore the practical length of the first step-impedance resonator and the second step-impedance resonator are shorter than one quarter wavelength of the operating frequency.

14. A filter structure, comprising:
    a top ground plane;
    an input electrode;
    an output electrode;
    a first coupling capacitive layer, positioned below the top ground plane, having a first metal piece, one side of the first metal piece connected to the input electrode;
    a second coupling capacitance layer, positioned below the first coupling capacitive layer, having a second metal piece, one side of the second metal piece connected to the output electrode;
    an inductance layer, having a third metal piece and a fourth metal piece, one side of the third metal piece connected to the input electrode to form the lumped inductor and one side of the fourth metal piece connected to the output electrode to form the lumped inductor;
    a capacitance layer, having a fifth metal piece and a sixth metal piece, one side of the fifth metal piece connected to the third metal piece and formed as the lumped capacitor, and one side of the sixth metal piece connected to the fourth metal piece and formed as the lumped capacitor;
    a middle ground plane, positioned below the capacitance layer;
    a step-impedance layer, positioned below the middle layer, having a seventh metal piece and an eighth metal piece, one side of the seventh metal piece connected to the input electrode and one side of the eighth metal piece connected to the output electrode; and
    a bottom ground plane, positioned below the step-impedance layer.

15. A filter structure as claimed in claim 14, wherein the filter structure is fabricated by the thick film technology.

16. A filter structure as claimed in claim 14, wherein the third metal piece and the fourth metal piece on the inductance layer can be three-dimensional to form the lumped inductor.

17. A filter structure as claimed in claim 14, wherein the fifth metal piece and the sixth metal piece on the capacitance layer can be inter-digital or three-dimensional of metal-insulator-metal to form the capacitor.

18. A filter structure as claimed in claim 14, wherein the third metal piece on the inductance layer and the fifth metal piece on the capacitance layer are in self series-resonance to provide a first transmission zero and the fourth metal piece on the inductance layer and the sixth metal piece on the capacitance layer are in self series-resonance to provide a second transmission zero.

19. A filter structure as claimed in claim 14, wherein the seventh metal piece and the eighth metal piece on the step impedance layer are formed by the transmission line of high impedance and low impedance.

20. A filter structure as claimed in claim 14, wherein the parasitic ground capacitance of the first coupling capacitance layer and the second coupling capacitance layer can be absorbed by the seventh metal piece and the eighth metal piece on the step-impedance layer, and therefore the practical length of the seventh metal piece and the eighth metal piece are shorter than one quarter wavelength of the operating frequency.

* * * * *